(12) United States Patent
Lee (10) Patent No.: US 9,679,746 B2
(45) Date of Patent: Jun. 13, 2017

(54) ION IMPLANTATION TOOL AND ION IMPLANTATION METHOD

(71) Applicant: TAIWAN SEMICONDUCTOR MANUFACTURING CO., LTD., Hsinchu (TW)

(72) Inventor: Sheng-Wei Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/925,875

(22) Filed: Oct. 28, 2015

(65) Prior Publication Data

US 2017/0125214 A1 May 4, 2017

(51) Int. Cl.
*H01J 37/36* (2006.01)
*H01J 37/317* (2006.01)
*H01L 21/265* (2006.01)
*H01J 37/147* (2006.01)
*H01J 37/20* (2006.01)

(52) U.S. Cl.
CPC ........ *H01J 37/3172* (2013.01); *H01J 37/147* (2013.01); *H01J 37/20* (2013.01); *H01L 21/265* (2013.01)

(58) Field of Classification Search
CPC ...... H01J 37/36; H01J 37/317; H01J 37/3171; H01J 37/3172; H01J 2237/31701
USPC ......... 250/396 R, 397, 492.1, 492.2, 492.22, 250/492.23, 492.3
See application file for complete search history.

(56) References Cited

U.S. PATENT DOCUMENTS

| | | | |
|---|---|---|---|
| 6,171,917 B1* | 1/2001 | Sun | H01L 21/31116 257/E21.252 |
| 2013/0248738 A1* | 9/2013 | Suuronen | H01J 37/3171 250/492.21 |
| 2015/0118832 A1* | 4/2015 | Wood | H01L 21/266 438/514 |

* cited by examiner

*Primary Examiner* — Nicole Ippolito
(74) *Attorney, Agent, or Firm* — Maschoff Brennan (57) ABSTRACT

An ion implantation tool includes a process chamber, a platen, an ion source, and a plurality of controlling units. The platen is present in the process chamber and configured to hold a wafer. The ion source is configured to provide an ion beam onto the wafer. The controlling units are present on the platen and configured to apply a plurality of physical fields that are able to affect motions of ions of the ion beam onto the wafer.

20 Claims, 12 Drawing Sheets

ION IMPLANTATION TOOL AND ION IMPLANTATION METHOD

BACKGROUND

Manufacturing of an integrated circuit (IC) has been driven by increasing the density of the IC formed in a semiconductor device. This is typically accomplished by implementing more aggressive design rules to allow a larger density of the IC device to be formed. Nonetheless, the increased density of IC devices, such as transistors, has also increased the complexity of processing semiconductor devices with decreased feature sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, operations, elements, and/or components, but do not preclude the presence or addition of one or more other features, regions, integers, operations, elements, components, and/or groups thereof.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
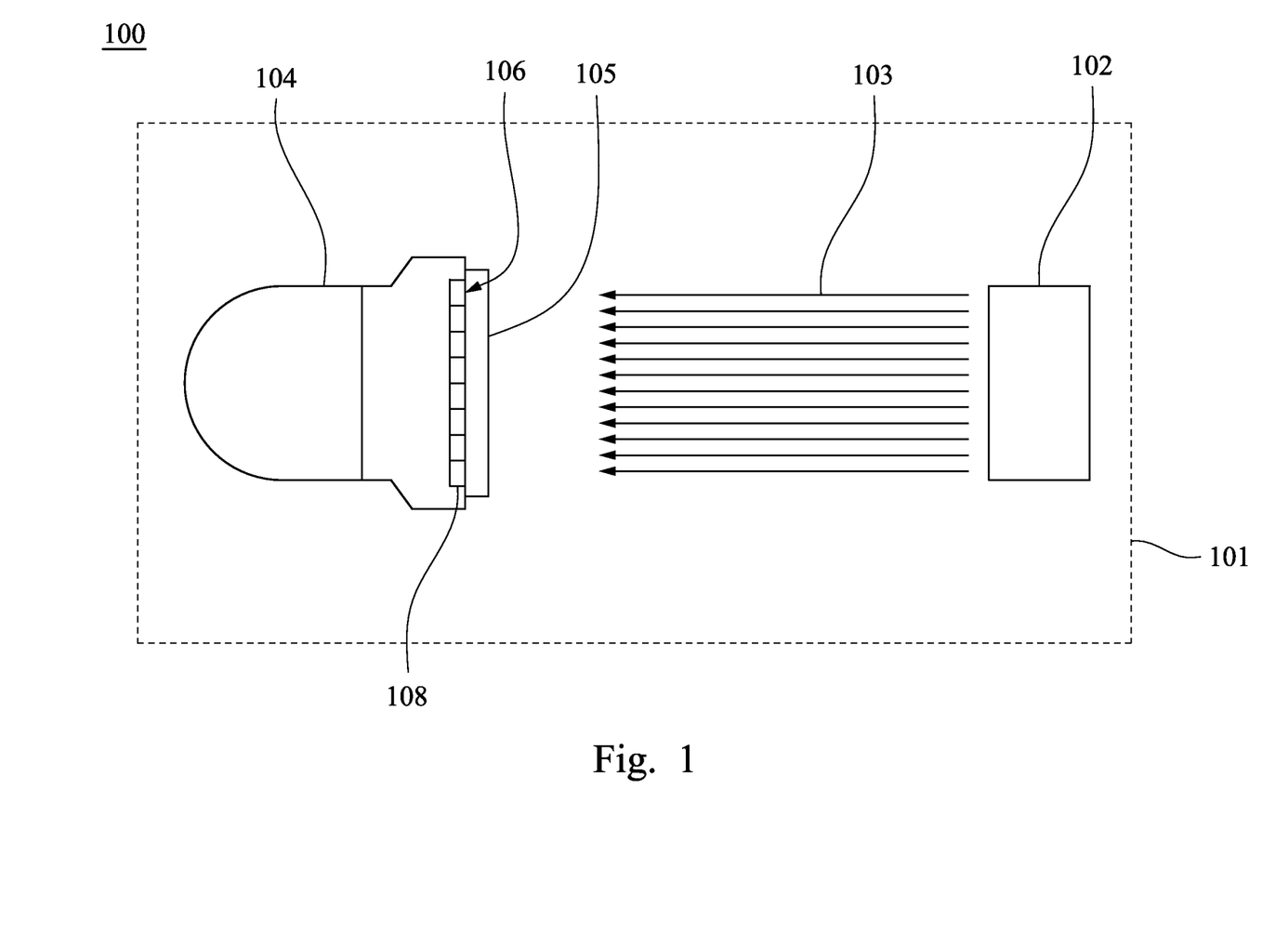
FIG. 1 is a side view of an ion implantation tool in accordance with some embodiments of the present disclosure.
Figure 2:
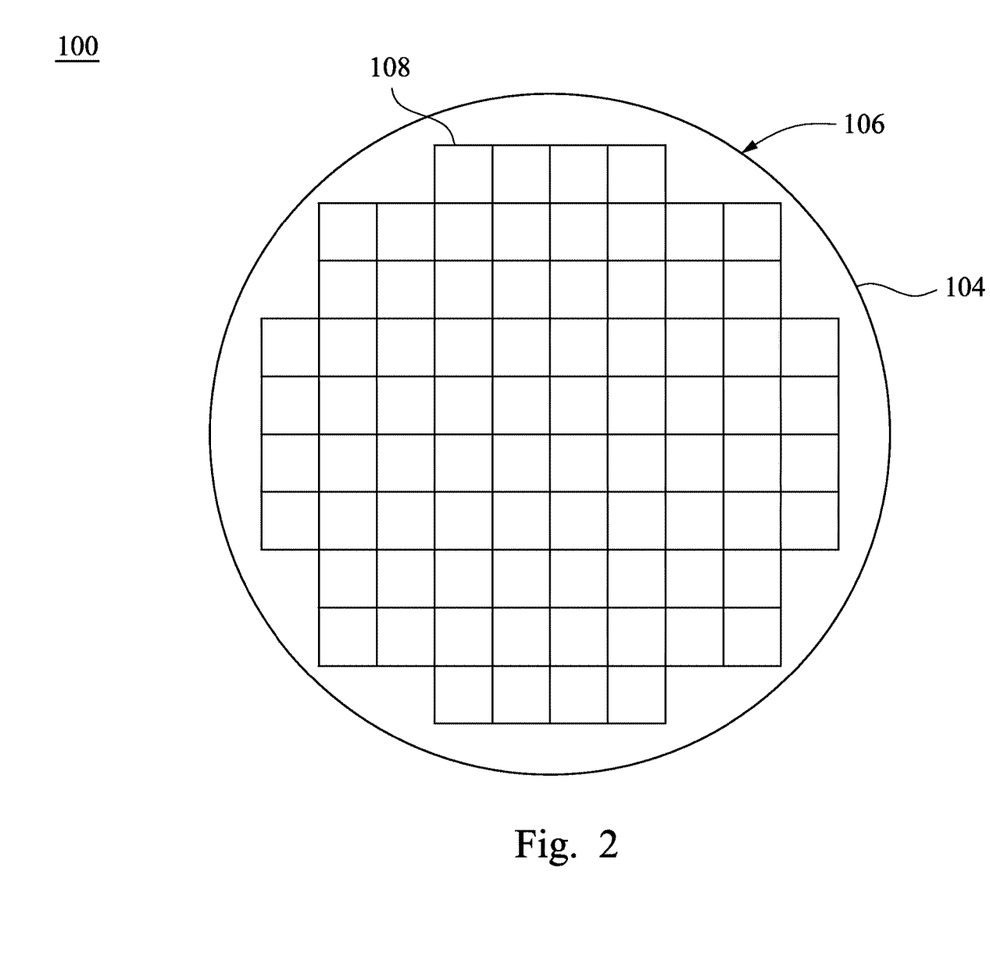
FIG. 2 is a front view of a platen of the ion implantation tool illustrated in FIG. 1 in accordance with some embodiments of the present disclosure, in which a wafer held by the platen is not illustrated.

Reference is made to FIGS. 1 and 2. FIG. 1 is a side view of an ion implantation tool 100 in accordance with some embodiments of the present disclosure. FIG. 2 is a front view of a platen 104 of the ion implantation tool 100 illustrated in FIG. 1 in accordance with some embodiments of the present disclosure, in which a wafer 105 held by the platen 104 is not illustrated. The ion implantation tool 100 includes a process chamber 101, the platen 104, an ion source 102, and controlling units 108. The platen 104 is present in the process chamber 101 and is configured to hold a wafer, e.g., the wafer 105 mentioned above. The ion source 102 is configured to provide an ion beam 103 onto the wafer 105, in which the ion beam 103 includes positive ions or negative ions. The controlling units 108 are present on the platen 104 and are configured to apply a plurality of physical fields that are able to affect motions of the ions of the ion beam 103 onto the wafer 105. Furthermore, in some embodiments, for generating the physical fields, the controlling units 108 are arranged in an array near a surface 106 of the platen 104 facing the wafer 105.

In some embodiments, the physical fields are generated on the surface 106 of the platen 104 facing the wafer 105, in which the physical fields affect the motions of the ions of the ion beam 103 by action at a distance. During an ion implantation process, before the ions of the ion beam 103 provided by the ion source 102 reach the wafer 105, the motions of the ions of the ion beam 103 are affected by the physical fields. Therefore, a distribution of the ions of the ion beam 103 onto the wafer 105 can be controlled by the physical fields. Moreover, the ion beam 103 can be controlled to be more uniform by the physical fields, such that beam uniformity at an edge of the ion beam 103 is improved, thereby increasing implantation quality of the ion implantation process. The following description is provided to explain how the physical fields affect the motions of the ions of the ion beam 103 onto the wafer 105.

Figure 3:
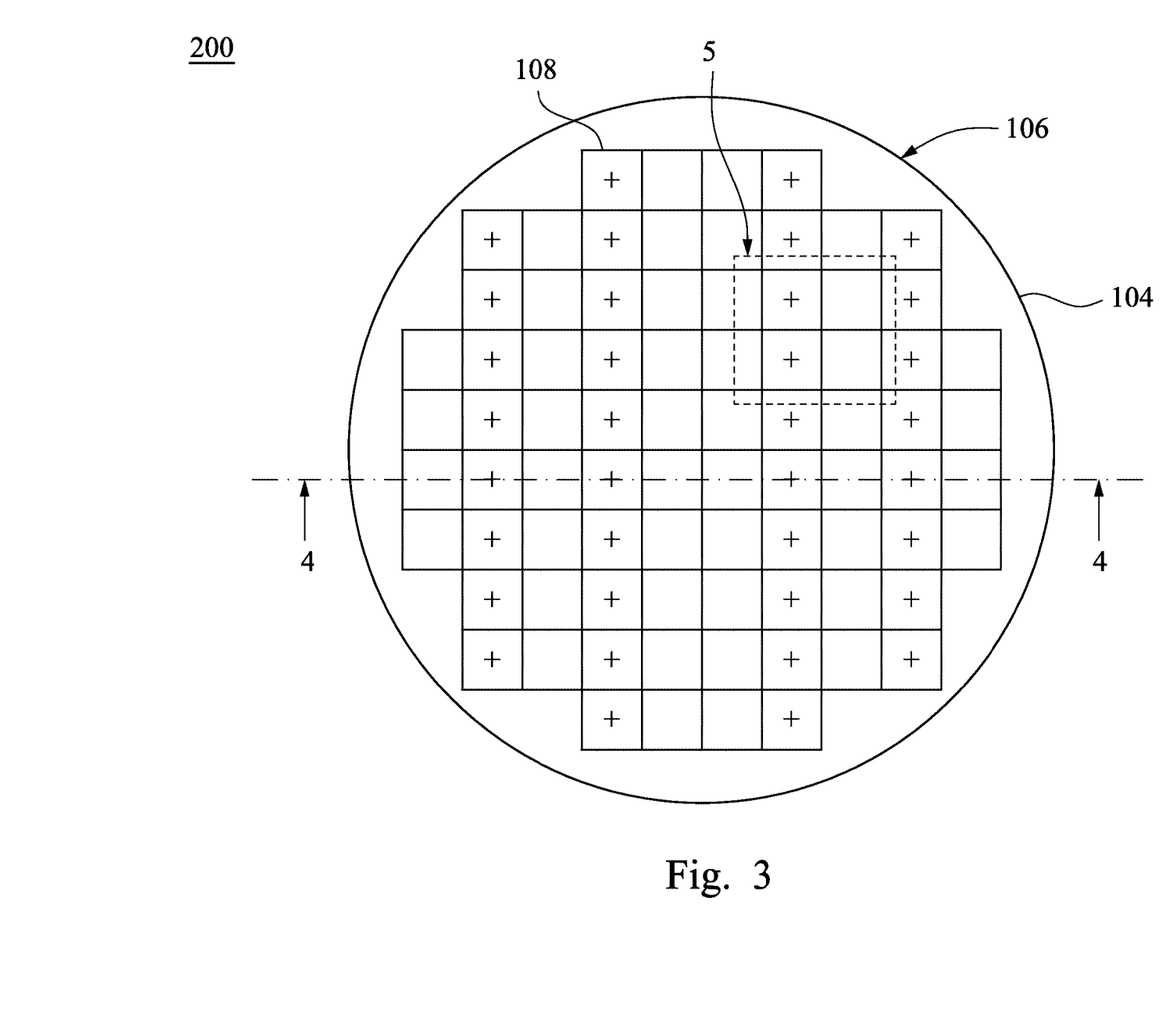
FIG. 3 is a front view of a platen of an ion implantation tool in accordance with some embodiments of the present disclosure, in which a wafer held by the platen is not illustrated.
Figure 4:
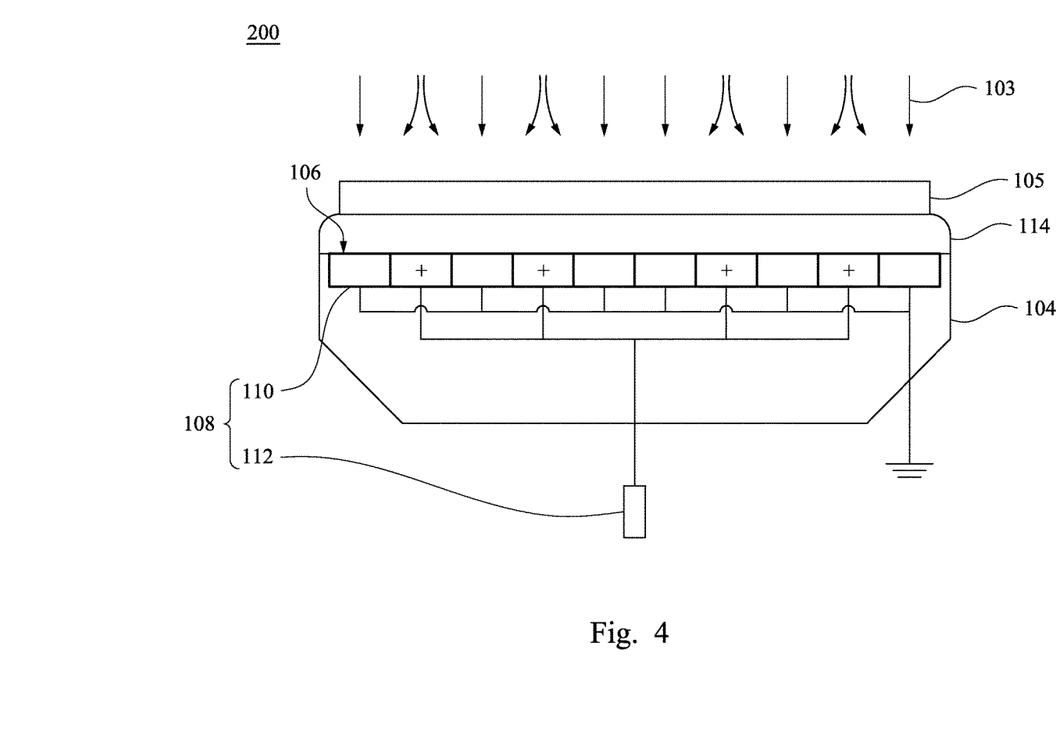
FIG. 4 is a cross-section diagram along a line 4-4 illustrated in FIG. 3 in accordance with some embodiments of the present disclosure.

FIG. 3 is a front view of a platen 104 of an ion implantation tool 200 in accordance with some embodiments of the present disclosure, in which a wafer held by the platen 104 (e.g., the wafer 105 mentioned above) is not illustrated. FIG. 4 is a cross-section diagram along a line 4-4 illustrated in FIG. 3 in accordance with some embodiments of the present disclosure. As shown in FIGS. 3 and 4, the controlling units 108 include electrodes 110 and an electrical potential provider 112. The electrodes 110 are present on the platen 104, and the electrical potential provider 112 is electrically connected to at least one of the electrodes 110.

In some embodiments, a plurality of the electrodes 110 are electrically connected to the electrical potential provider 112, and the other electrodes 110 are electrically connected to ground potential. With this configuration, as the electrical potential provider 112 provides the electrodes 110 electrically connected thereto with a positive potential, physical fields are generated on the surface 106 of the platen 104. Explained in a different way, since the physical fields are generated by the positive potential, at least one of the physical fields is an electrical field. In such embodiments involving generating the electrical fields, the motions of the ions of the ion beam 103 are affected by the electrical fields. In some embodiments, at least one of the controlling units 108 is taken as an electrical potential provider configured to generate at least one of the electrical fields.

As described above, since the ion beam 103 includes the positive ions or the negative ions, the motions of the positive ions or the negative ions are affected by the electrical fields. For example, under a situation in which the ion beam 103 includes the positive ions, since the electrical fields on the surface 106 of the platen 104 are generated by the controlling units 108 with the positive potential, the motions of the positive ions of the ion beam 103 are affected by a repulsive force. Explained in a different way, before the positive ions of the ion beam 103 reach the wafer 105, the positive ions of the ion beam 103 are affected by the repulsive force. Therefore, the distribution of the positive ions of the ion beam 103 onto the wafer 105 is controlled.

In addition, since a portion of the electrodes 110 are electrically connected to the ground potential, the positive ions traveling toward the electrodes 110 electrically connected to the ground potential are affected less. That is, since the electrodes 110 electrically connected to the positive potential and the electrodes 110 electrically connected to the ground potential affect the positive ions with different magnitudes of the repulsive force, the electrodes 110 are arranged to correspond to a predetermined dose distribution of the wafer 105 in accordance with some embodiments. For example, under a situation in which the ions of the ion beam 103 are the positive ions, the electrodes 110 electrically connected to the positive potential correspond to regions of the wafer 105 predetermined to have a lower dose distribution (thus, lower dose density), and electrodes 110 electrically connected to the ground potential correspond to regions of the wafer 105 predetermined to have a higher dose distribution (thus, higher dose density). In other words, a dose distribution of the wafer 105 is controlled by different magnitudes of the repulsive force generated by the controlling units 108.

Moreover, under a situation in which the distribution of the ions of the ion beam 103 onto the wafer 105 is controllable, the number of rotations of the wafer 105 is reduced. Thus, in the ion implantation process, for improving the ion beam uniformity (that is, the dose distribution) at edges of the wafer 105, the wafer 105 is rotated, in which the number of rotations of the wafer 105 is relative to the beam uniformity of the wafer 105. Through controlling the distribution of the ions of the ion beam 103 onto the wafer 105 by the electric fields, the beam uniformity at the edges of the wafer 105 is improved, and the number of rotations of the wafer 105 is reduced. Therefore, a WPH (wafer processing amount per hour) is correspondingly increased, thereby raising production efficiency.

Furthermore, in some embodiments, the ion implantation tool 200 further includes a dielectric layer 114. The dielectric layer 114 is disposed on the surface 106 of the platen 104, that is, between the platen 104 and the wafer 105. The dielectric layer 114 is configured to adjust an operating time associated with applying the repulsive force to the positive ions. For example, under a condition in which the dielectric layer 114 has a large thickness, since a distance between the wafer 105 and the ion source 102 (see FIG. 1) is decreased, a path of the ion beam 103 from the ion source 102 (see FIG. 1) to the wafer 105 is reduced. Therefore, the motions of the positive ions of the ion beam 103 onto the wafer 105 are affected within a shorter period, and the positive ions of the ion beam 103 may have less displacement that is horizontal to the wafer 105. On the other hand, under a condition in which the dielectric layer 114 has a small thickness, since a distance between the wafer 105 and the ion source 102 (see FIG. 1) is increased, a path of the ion beam 103 from the ion source 102 (see FIG. 1) to the wafer 105 is increased. Therefore, the motions of the positive ions of the ion beam 103 onto the wafer 105 are affected within a longer period, and the positive ions of the ion beam 103 may have greater displacement that is horizontal to the wafer 105. That is, the thickness of the dielectric layer 114 is related to the horizontal displacement of the positive ions. Furthermore, in some embodiments, the dielectric layer 114 is omitted from the configuration of the ion implantation tool 200, and the wafer 105 is disposed on the surface 106 of the platen 104 in a state contacting the platen 104.

Figure 5:
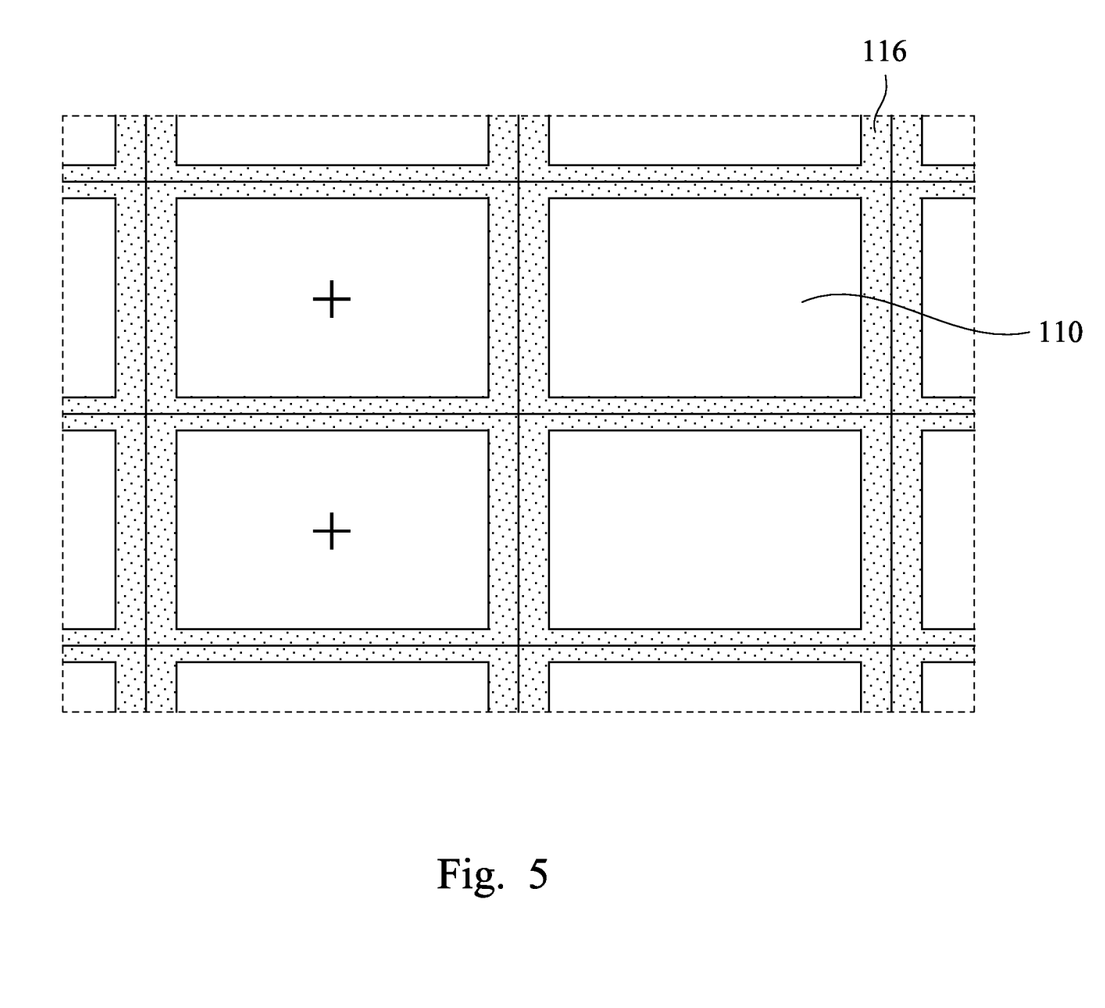
FIG. 5 is an enlarged view of an area 5 illustrated in FIG. 3 in accordance with some embodiments of the present disclosure.

FIG. 5 is an enlarged view of an area A illustrated in FIG. 3 in accordance with some embodiments of the present disclosure. As shown in FIGS. 3 and 5 the ion implantation tool 200 further includes an insulating layer 116. The insulating layer 116 is disposed on the platen 104 and is grid-shaped, in which the electrodes 110 of the controlling units 108 are insulated from each other by the insulating layer 116. Therefore, the electrodes 110 of the controlling units 108 are disposed to be separated from each other, and hence no current flows therebetween. Explained in a different way, since the electrodes 110 of the controlling units 108 are insulated from each other by the insulating layer 116, the electric fields generated by the electrodes 110 of the controlling units 108 are stable during the ion implantation process.

Figure 6:
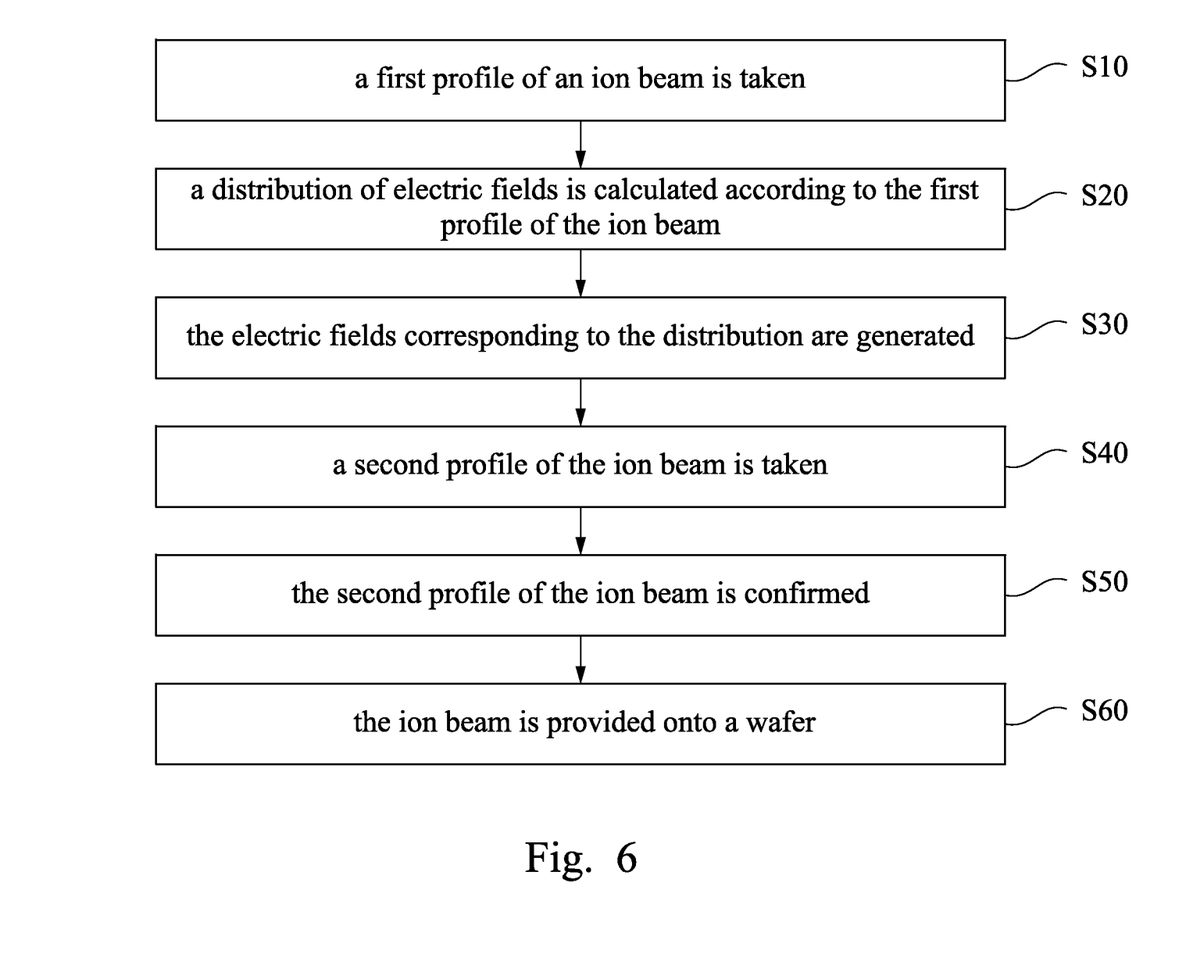
FIG. 6 is a flowchart of operations of an ion implantation process in accordance with some embodiments of the present disclosure.

FIG. 6 is a flowchart of operations S10-S60 of an ion implantation process in accordance with some embodiments of the present disclosure. In some embodiments, an ion implantation process includes operations S10-S60. The ion implantation process begins with operation S10 in which a first profile of an ion beam is taken. The ion implantation process continues with operation S20 in which a distribution of electric fields is calculated according to the first profile of the ion beam. The ion implantation process continues with operation S30 in which the electric fields corresponding to the distribution are generated. The ion implantation process continues with operation S40 in which a second profile of the ion beam is taken. The ion implantation process continues with operation S50 in which the second profile of the ion beam is confirmed. The ion implantation process continues with operation S60 in which the ion beam is provided onto a wafer.

In the operation S10, an ion beam is provided by an ion source, and a first profile of the ion beam is recorded. For example, the first profile of the ion beam includes a distribution of ions of the ion beam and beam uniformity of the ion beam.

In the operation S20, according to the first profile of the ion beam, a distribution of electric fields is calculated, in which the distribution of the electric fields includes the magnitude of the electric fields. Thus, the magnitude of the electric potential provided by an electrical potential provider of controlling units is calculated and determined according to the first profile of the ion beam.

In the operation S30, the electric fields are generated by electrodes of the controlling units, in which the characteristics of the electric fields are provided according to the distribution of electric fields calculated and determined in the operation S20.

In the operation S40, since motions of ions of the ion beam provided by the ion source are affected by the electric fields, the profile of the ion beam is varied to be different from the first profile of the ion beam described in the operation S10. Thus, the profile of the ion beam is changed after applying the electric fields, and this changed profile is recorded as a second profile.

In the operation S50, the second profile described in the operation S40 is confirmed to determine whether the distribution of the ions of the ion beam and the beam uniformity of the ion beam are acceptable. Explained in a different way, after applying the electric fields, the profile of the ion beam is re-taken to determine whether the distribution of the ions of the ion beam and the beam uniformity of the ion beam are acceptable. In some embodiments, at least one of the distribution of the ions of the ion beam and the beam uniformity of the ion beam is adjusted after the confirmation of the second profile. For example, in some embodiments, after the confirmation of the second profile, the magnitude of the electric potential provided by the electrical potential provider of the controlling units is adjusted to be larger or smaller.

In the operation S60, after the profile of the ion beam is confirmed, a wafer is disposed on a platen to implant the wafer with the ion beam. In some embodiments, after the profile of the ion beam is confirmed to be acceptable, the electric fields that are able to affect the motions of the ions of the ion beam are applied. In some embodiments, the electric fields are respectively applied onto a plurality of regions of the wafer after the wafer is disposed on the platen. Through applying electric fields respectively onto the regions of the wafer, the ions of the ion beam corresponding to the different regions of the wafer are respectively affected by the electric fields, and hence the distribution of the ions of the beam onto the wafer is controllable, thereby controlling a dose contribution of the wafer.

Figure 7:
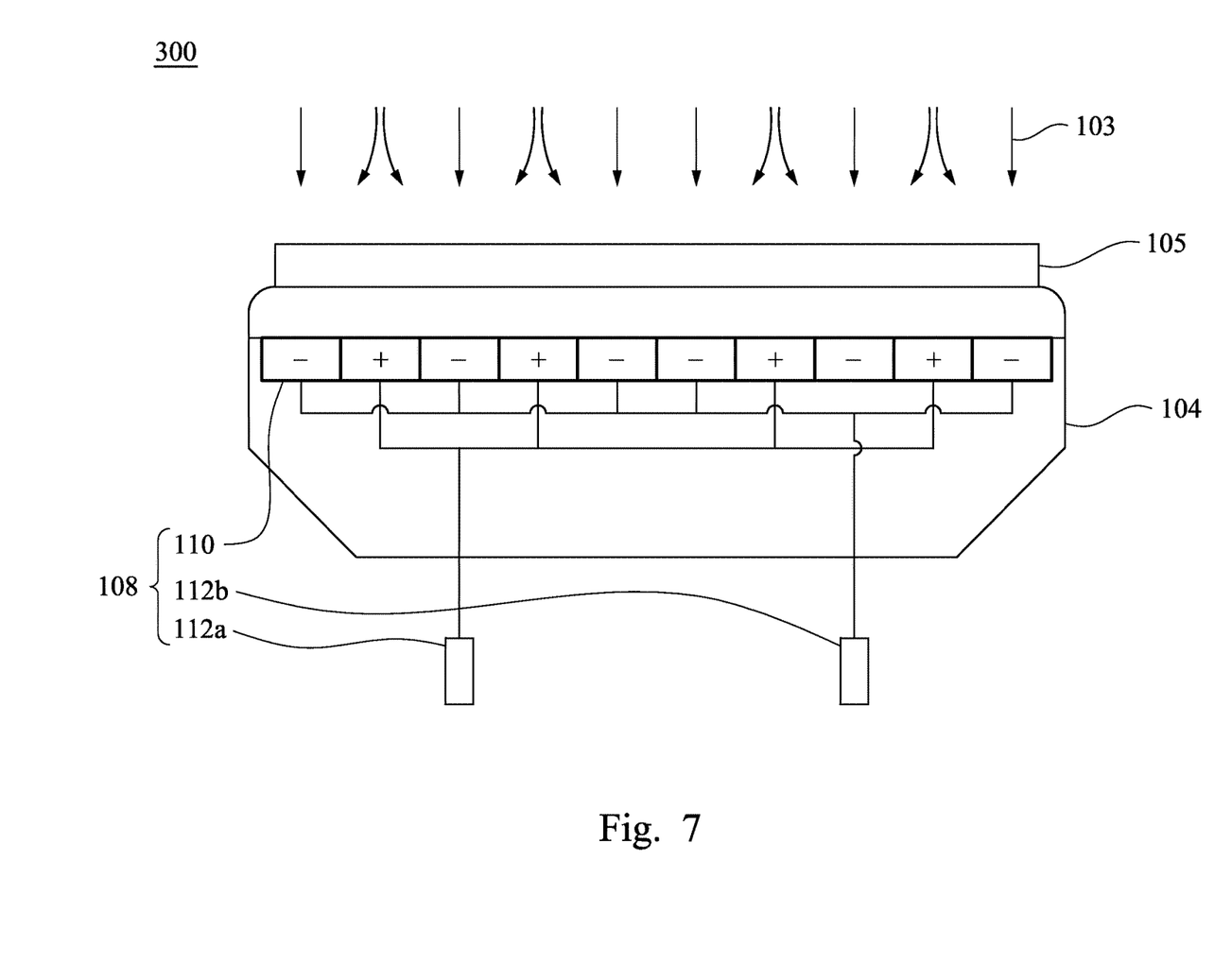
FIG. 7 is a cross-section diagram of a platen of an ion implantation tool in accordance with some embodiments of the present disclosure, in which the cross section is taken along a similar plane of the platen as in the case of FIG. 4.

FIG. 7 is a cross-section diagram of a platen 104 of an ion implantation tool 300 in accordance with some embodiments of the present disclosure, in which the cross section is taken along a similar plane of the platen as in the case of FIG. 4. As shown in FIG. 7, the number of the electrical potential providers 112a and 112b is two, in which a first group of the electrodes 110 is electrically connected to one of the electrical potential providers 112a and 112b and a second group of the electrodes 110 is electrically connected to the other one of the electrical potential providers 112a and 112b. Thus, in some embodiments, the first group and the second group of the electrodes 110 are respectively electrically connected to the electrical potential providers 112a and 112b. In some embodiments, the first group of the electrodes 110 electrically connected to the electrical potential provider 112a is provided with a positive electrical potential, and the second group of the electrodes 110 electrically connected to the electrical potential provider 112b is provided with a negative electrical potential. In some embodiments, the first group of the electrodes 110 electrically connected to the electrical potential provider 112a is provided with a positive electrical potential that is greater than the positive electrical potential that is provided to the second group of the electrodes 110 by the electrical potential provider 112b.

Furthermore, in some embodiments, the electrodes 110 provided with the positive potential are taken as first passive elements, the electrical potential provider 112a is taken as a first driving unit configured to drive the first passive elements to generate first fields, the electrodes 110 provided with the negative potential are taken as second passive elements, and the electrical potential provider 112b is taken as a second driving unit configured to drive the second passive elements to generate second fields. In this case, at least one of the first fields and the second fields is an electric field. In some embodiments, the first fields and the second fields have different directions, in which directions of the first fields and the second fields are opposite to each other. For example, since the first fields are the electric field generated by the electrodes 110 provided with the positive potential, the direction of at least one of the first fields is divergent therefrom. Similarly, since the second fields are the electric field generated by the electrodes 110 provided with the negative potential, the direction of at least one of the second fields is convergent thereto.

With this configuration, under a situation in which ions of an ion beam 103 emitted toward a wafer 105 are positive ions, a portion of the positive ions is repulsed by the electrodes 110 provided with the positive potential and another portion of the positive ions is attracted by the electrodes 110 provided with the negative potential. In the embodiments in which the ions of the ion beam 103 are positive ions, the electrodes 110 provided with the positive potential are configured to lower the dose density of a portion of regions of the wafer, and the electrodes 110 provided with the negative potential are configured to heighten the dose density of another portion of regions of the wafer. Explained in a different way, the electrodes 110 provided with the positive potential and the negative potential are arranged according to a predetermined dose distribution of the wafer 105.

Figure 8:
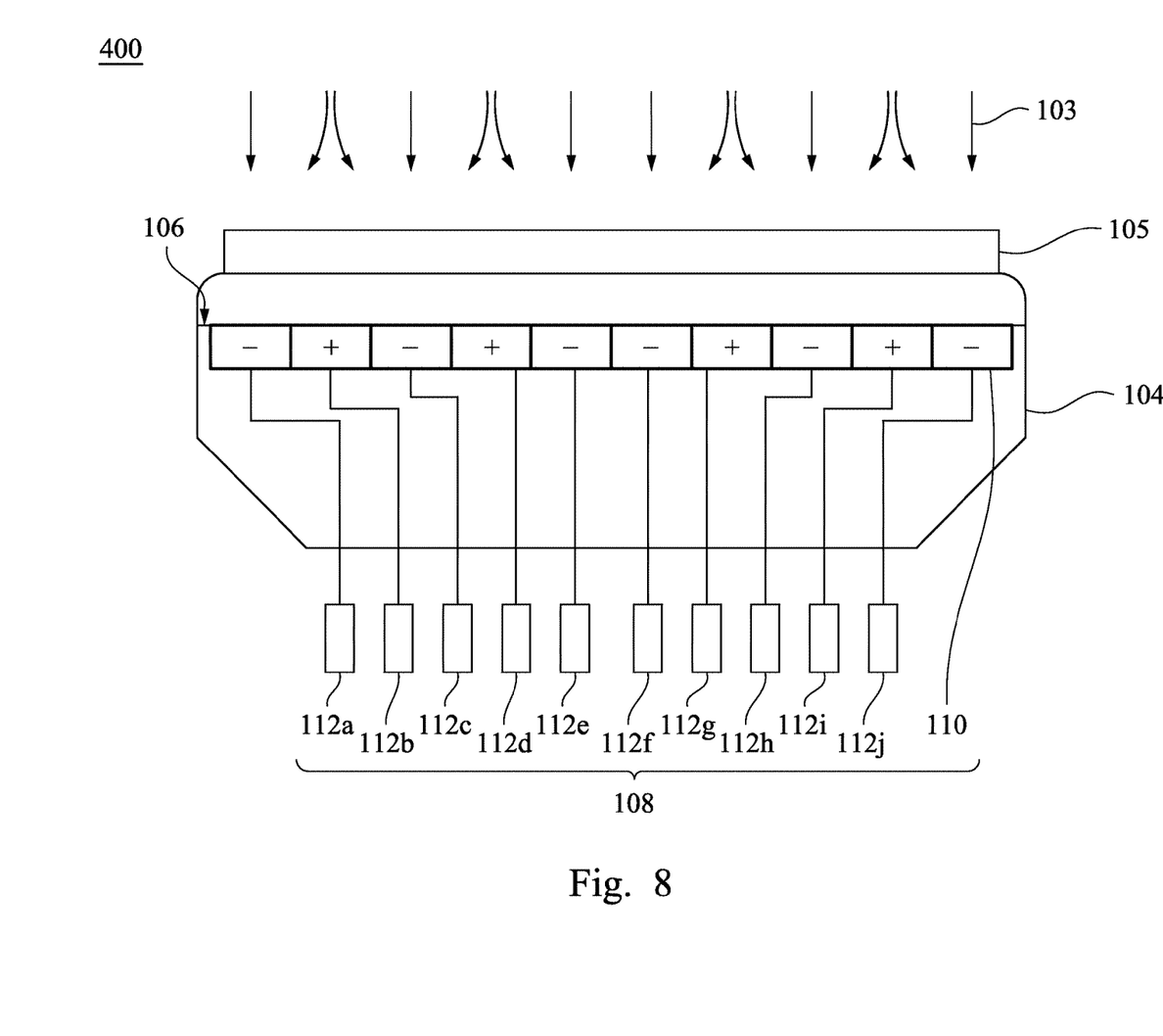
FIG. 8 is a cross-section diagram of a platen of an ion implantation tool in accordance with some embodiments of the present disclosure, in which the cross section is taken along a similar plane of the platen as in the case of FIG. 4.

FIG. 8 is a cross-section diagram of a platen 104 of an ion implantation tool 400 in accordance with some embodiments of the present disclosure, in which the cross section is taken along a similar plane of the platen as in the case of FIG. 4. As shown in FIG. 8, the number of the electrical potential providers 112a-112j is plural, and the electrodes 110 are respectively electrically connected to the electrical potential providers 112a-112j. Explained in a different way, the numbers of the electrodes 110 and the electrical potential providers 112a-112j are the same, and the electrodes 110 are electrically connected to the electrical potential providers 112a-112j in a one-to-one relationship.

With this configuration, at least one of the electrodes 110 is individually provided with an electric potential by one of the electrical potential providers 112a-112j. Explained in a different way, the characteristic of the electric potential of at least one of the electrodes 110 may be controlled to be different from that of at least one of the other electrodes 110. For example, a magnitude of the electric potential of the electrode 110 provided by the electrical potential provider 112a is different from the magnitudes of the electric potentials of the electrodes 110 provided by the electrical potential providers 112b-112j. Furthermore, in some embodiments, a polarity of the electric potential (i.e., positive or negative) of at least one of the electrodes 110 provided by the electrical potential providers 112a-112j is individually controlled. In some embodiments, the electrodes 110 are provided with a negative potential by the electrical potential providers 112a, 112c, 112e, 112f, 112h, and 112j, and the electrodes 110 are provided with a positive potential by the electrical potential providers 112b, 112d, 112g, and 112i.

In some embodiments, at least one of the electrodes 110 near the surface 106 of the platen 104 is taken as a pixel, and the distribution of the electric fields generated by the electrodes 110 is adjusted through individually controlling the electrodes 110. Explained in a different way, motions of ions of an ion beam 103 respectively onto a plurality of regions of the wafer 105 are respectively controlled by electric fields generated by the electrodes 110. For example, under a situation in which the ions of the ion beam 103 are positive ions, if dose density in a region of the wafer 105 corresponding to the electrode 110 electrically connected to the electrical potential provider 112b is higher than a predetermined value, the electric field generated by the electrode 110 electrically connected to the electrical potential provider 112b is controlled to be higher, so as to repulse more positive ions thereon.

On the other hand, under the same situation, if the dose density in the region of the wafer 105 corresponding to the electrode 110 electrically connected to the electrical potential provider 112b is less than the predetermined value, the electric field generated by the electrode 110 electrically connected to the electrical potential provider 112b is controlled to be lower, so as to repulse positive ions thereon less. Alternatively, if the dose density in the region of the wafer 105 corresponding to the electrode 110 electrically connected to the electrical potential provider 112b is less than the predetermined value, the electric field generated by the electrode 110 electrically connected to the electrical potential provider 112b is controlled to be changed from positive to negative, so as to attract positive ions thereon.

Figure 9:
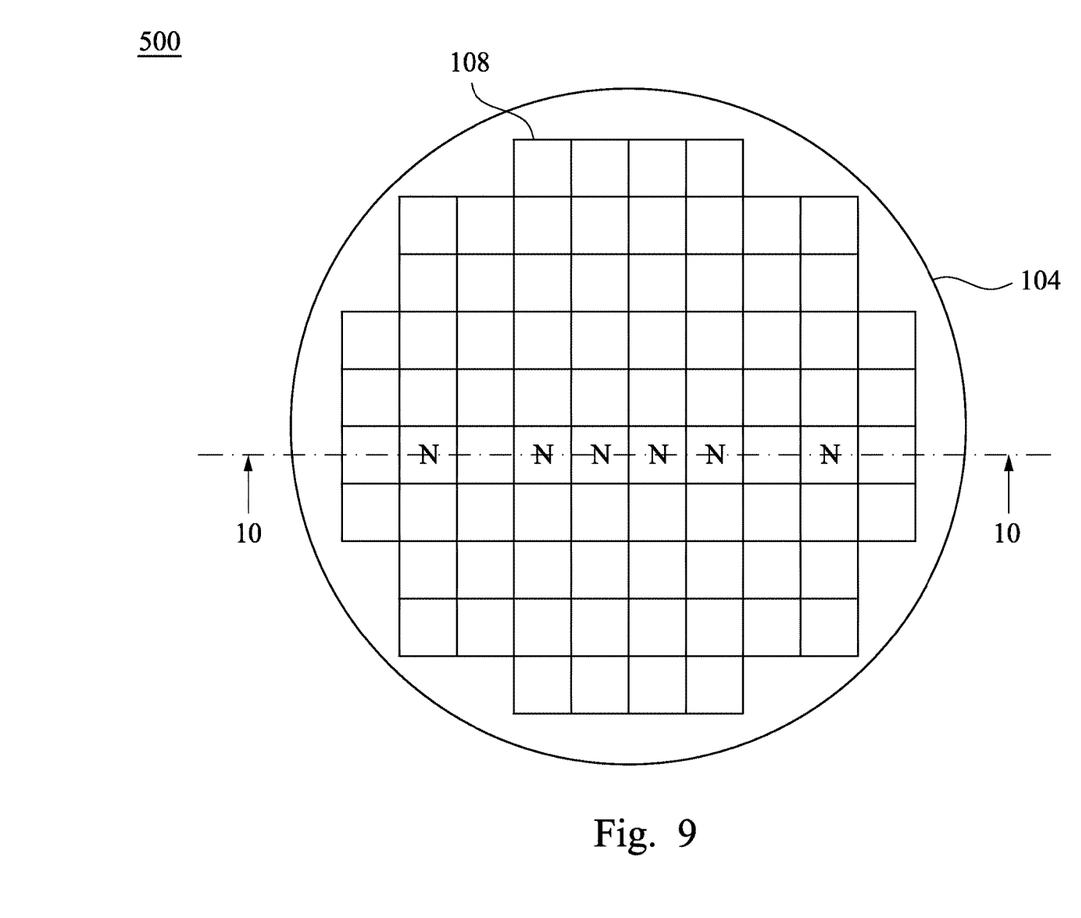
FIG. 9 is a front view of a platen of an ion implantation tool in accordance with some embodiments of the present disclosure, in which a wafer held by the platen is not illustrated.
Figure 10:
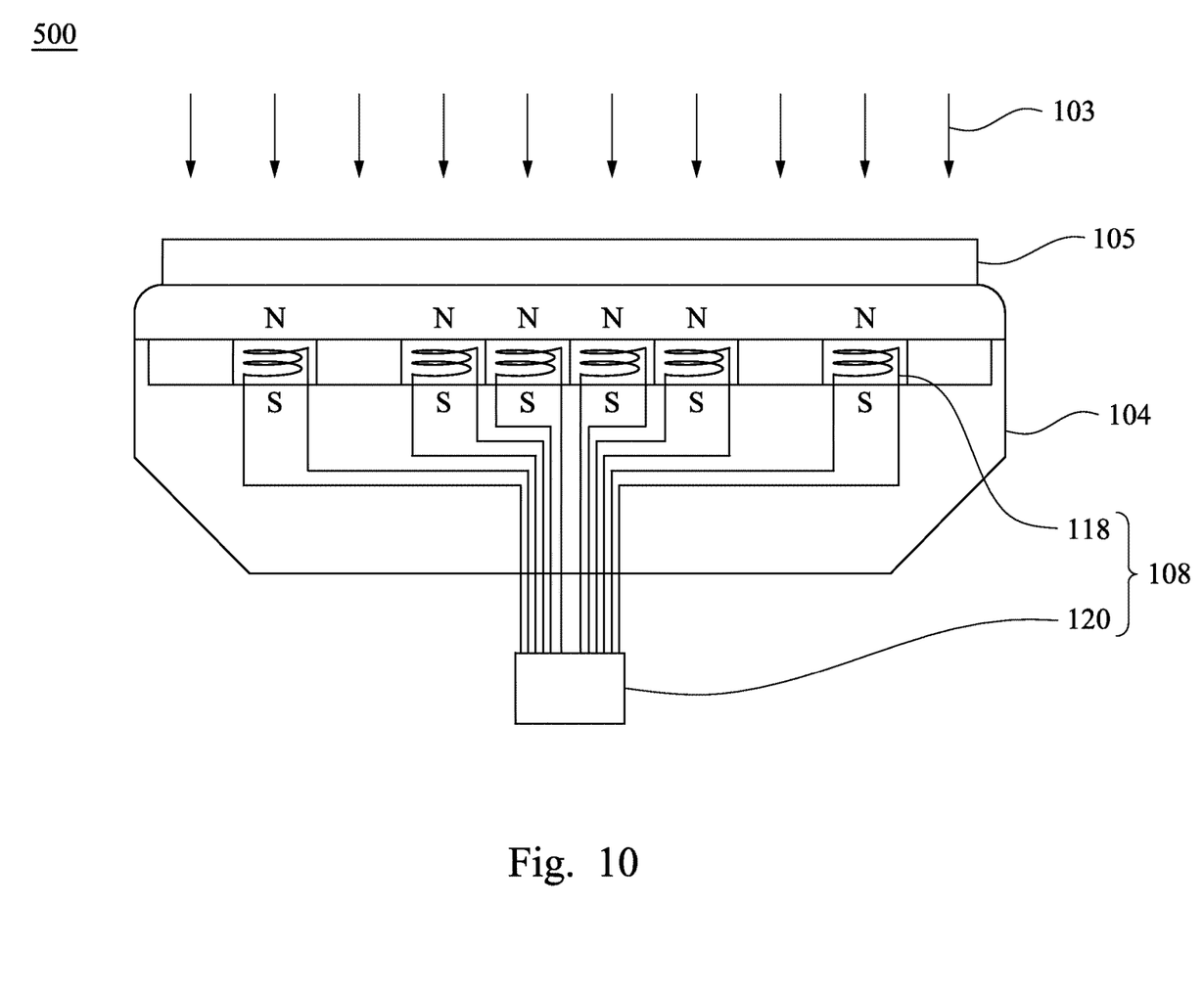
FIG. 10 is a cross-section diagram along a line 10-10 illustrated in FIG. 9 in accordance with some embodiments of the present disclosure.

FIG. 9 is a front view of a platen 104 of an ion implantation tool 500 in accordance with some embodiments of the present disclosure, in which a wafer held by the platen 104 (e.g., the wafer 105 mentioned above) is not illustrated. FIG. 10 is a cross-section diagram along a line 10-10 illustrated in FIG. 9 in accordance with some embodiments of the present disclosure. As shown in FIGS. 9 and 10, at least one of the physical fields generated by the controlling units 108 is a magnetic field.

In some embodiments, the controlling units 108 include coils 118 and an electricity provider 120. The coils 118 are present on the platen 104, and the electricity provider 120 is electrically connected to at least one of the coils 118 for providing current. Thus, a plurality of the coils 118 are electrically connected to the electricity provider 120. With this configuration, since the current flows to at least one of the coils 118, a pair of magnetic poles are generated at two opposite sides of at least one of the coils 118. In some embodiments, the current directions in the coils 118 are the same, and the magnetic poles generated by the coils 118 at sides of the coils 118 facing the wafer 105 are N poles. In other embodiments, the magnetic poles generated by the coils 118 at sides of the coils 118 facing the wafer 105 are S poles.

According to the Lorentz force law, a magnetic force is generated on a point charge due to electromagnetic fields. Thus, if a point charge moves with velocity in the presence of a magnetic field, this point charge is applied by the magnetic force thereon. Since ions of an ion beam 103 are charged particles, the ions of the ion beam 103 are applied by the magnetic force in the magnetic fields generated by the coils 118 of the controlling units 108. As previously described, in some embodiments, in physical fields, the force that relates to attracting or repulsing the ions of the ion beam 103 is configured to control the distribution of the ions of the ion beam 103. Explained in a different way, in some embodiments, the controlling units 108 are magnetic field providing units, and the at least one magnetic force caused by the magnetic fields generated by controlling units 108 is configured to affect the motions of the ions of the ion beam 103, so as to control the distribution of the ions of the ion beam 103.

Furthermore, in some embodiments, a first group of the controlling units 108 is electrical field providing unit and a second group of the controlling units 108 is magnetic field providing unit, and therefore the electric fields and the magnetic fields are generated on the platen 104. Thus, at least two of the physical fields on the platen 104 are different. In embodiments in which the electric fields and the magnetic fields are generated on the platen 104, the electrode 110 (see FIG. 3) and the coils 118 are present on the platen 104. In embodiments in which the electric fields and the magnetic fields are generated on the platen 104, the motions of the ions of the ion beam 103 are affected by the electric fields and the magnetic fields when the ion beam 103 is provided onto the wafer 105.

Figure 11:
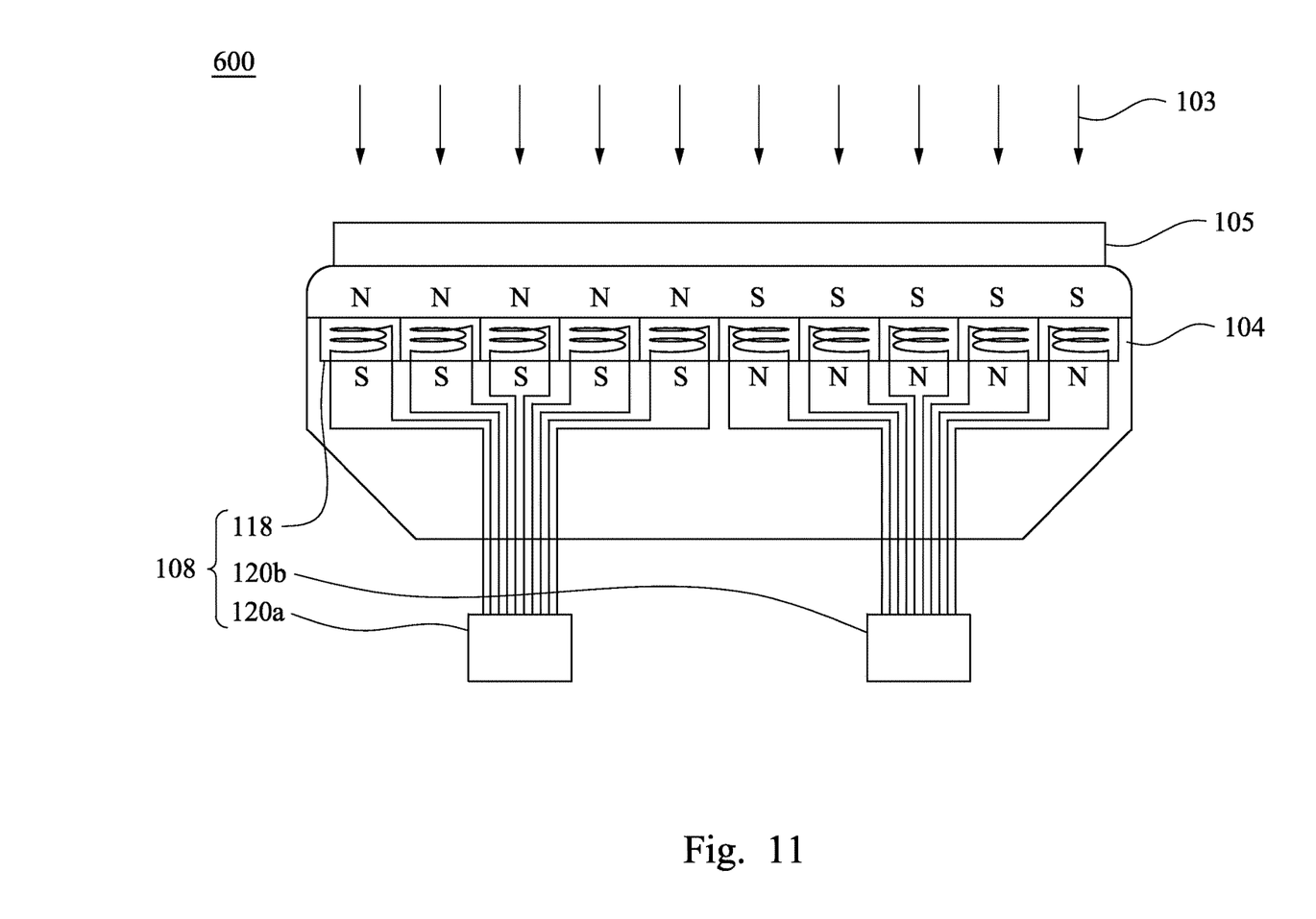
FIG. 11 is a cross-section diagram of a platen of an ion implantation tool in accordance with some embodiments of the present disclosure, in which the cross section is taken along a similar plane of the platen as in the case of FIG. 10.

FIG. 11 is a cross-section diagram of a platen 104 of an ion implantation tool 600 in accordance with some embodiments of the present disclosure, in which the cross section is taken along a similar plane of the platen as in the case of FIG. 10. As shown in FIG. 11, the number of the electricity providers 120a and 120b is two, in which a first group of the coils 118 is electrically connected to one of the electricity providers 120a and 120b and a second group of the coils 118 is electrically connected to the other one of the electricity providers 120a and 120b. Thus, in some embodiments, the first group and the second group of the coils 118 are respectively electrically connected to the electrical potential providers electricity providers 120a and 120b. In some embodiments, the first group of the coils 118 electrically connected to the electricity provider 120a is provided with a current with a first direction to generate the N poles facing the wafer 105, and the second group of the coils 118 electrically connected to the electricity provider 120b is provided with a current with a second direction to generate the S poles facing the wafer 105.

Furthermore, in some embodiments, the coils 118 generating the N poles facing the wafer 105 are taken as first passive elements, the electricity provider 120a is taken as a first driving unit configured to drive the first passive elements to generate first fields, the coils 118 generating the S poles facing the wafer 105 are taken as second passive elements, and the electricity provider 120b is taken as a second driving unit configured to drive the second passive elements to generate second fields. In this case, at least one of the first fields and the second fields is a magnetic field. In some embodiments, the first fields and the second fields have different directions, in which directions of the first fields and the second fields are opposite to each other. For example, for the coils 118 electrically connected to the electricity provider 120a, since the direction of the magnetic fields is from the N poles to the S poles, the direction of the first fields at the N poles facing the wafer 105 is divergent. On the other hand, for the coils 118 electrically connected to the electricity provider 120b, since the direction of the magnetic fields is from the N poles to the S poles, the direction of the second fields at the S poles facing the wafer 105 is convergent.

With this configuration, since ions of an ion beam 103 provided with a wafer 105 are charge particles, motions of the ions of the ion beam 103 are affected by the magnetic fields due to magnetic force. Furthermore, the motions of the ions of the ion beam 103 are affected to move toward different directions since there two types of the magnetic fields. Thus, the ions of the ion beam 103 propagating toward the first fields and the ions of the ion beam propagating toward the second fields are respectively applied by the magnetic force with different directions, in which these two different directions are opposite to each other according to the Lorentz force. In some embodiments, the coils 118 respectively generating the N poles and the S poles facing the wafer 105 are arranged according to a pre-determined distribution of the dose density of the wafer 105.

Figure 12:
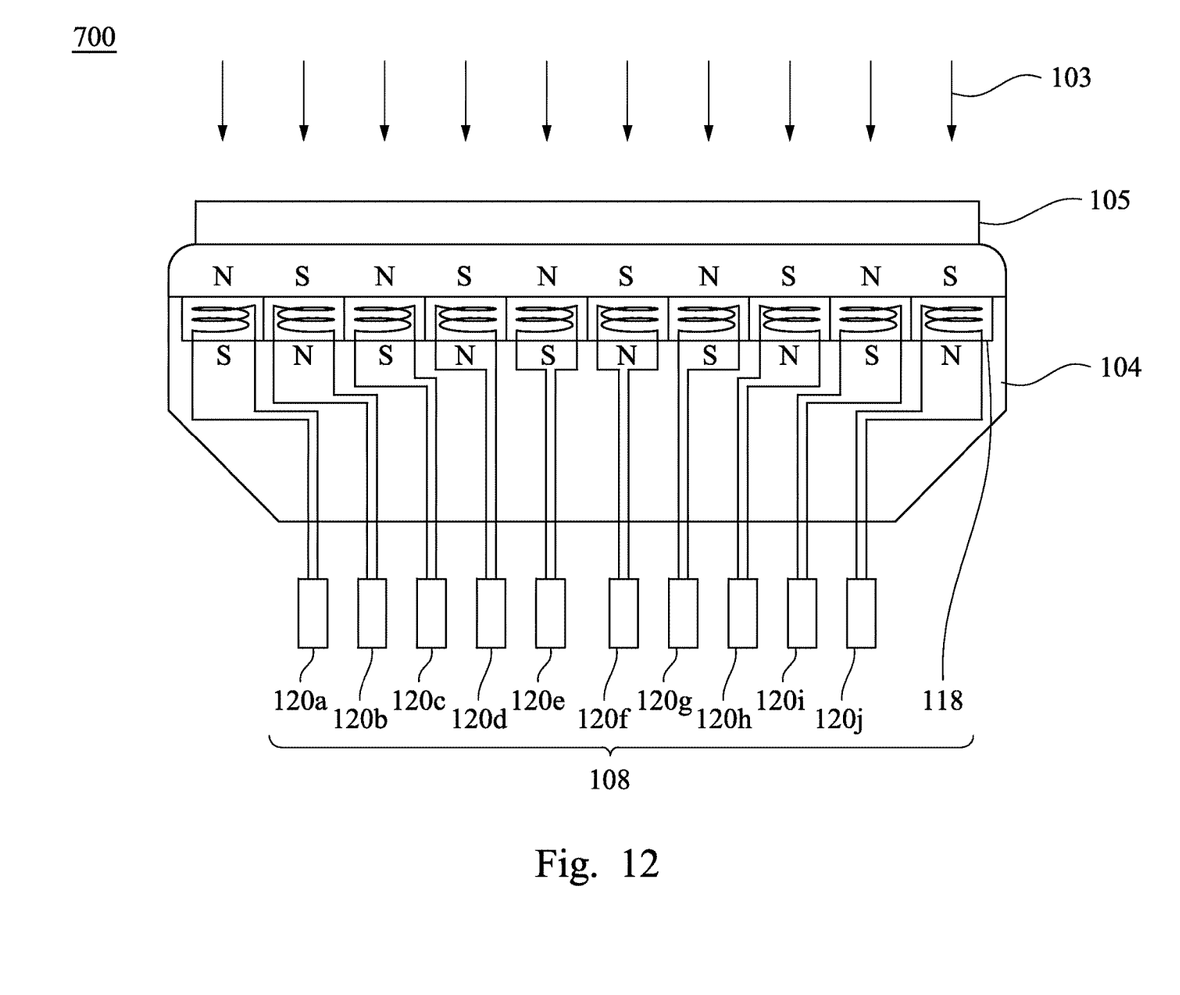
FIG. 12 is a cross-section diagram of a platen of an ion implantation tool in accordance with some embodiments of the present disclosure, in which the cross section is taken along a similar plane of the platen as in the case of FIG. 10.

FIG. 12 is a cross-section diagram of a platen 104 of an ion implantation tool 700 in accordance with some embodiments of the present disclosure, in which the cross section is taken along a similar plane of the platen as in the case of FIG. 10. As shown in FIG. 12, the number of the electricity providers 120a-120j is plural, and a plurality of the coils 118 are respectively electrically connected to the electricity providers 120a-120j. Explained in a different way, the numbers of the coils 118 and the electricity providers 120a-120j are the same, and the coils 118 are electrically connected to the electricity providers 120a-120j in a one-to-one relationship.

With this configuration, at least one of the coils 118 is individually provided with a current by one of the electricity providers 120a-120j. Explained in a different way, the characteristic of the magnetic field generated by at least one of the coils 118 may be controlled individually. For example, a magnitude of the magnetic field generated by the coil 118 electrically connected to electricity provider 120a is different from the magnitudes of the magnetic fields generated by the coils 118 electrically connected to electricity providers 120b-120j. Through individually controlling the characteristic of the magnetic field generated by at least one of the coils 118, a distribution of dose density of the wafer 105 is controllable. In this case, dose densities of regions of the wafer 105 are controllable.

As described above, in the ion implantation tool of the present disclosure, the motions of the ions of the ion beam are affected by the physical fields generated by the controlling units, in which one of the physical fields are the electric field, the magnetic field or a combination thereof. Therefore, the distribution of the ions of the ion beam onto the wafer can be controlled by the physical fields. Moreover, since the ion beam can be controlled to be more uniform by the physical fields, the beam uniformity at the edge of the ion beam is improved, thereby increasing the implantation quality of the ion implantation process. Furthermore, according to the pre-determined distribution of the dose density in the wafer, the dose density in at least one of the regions of the wafer is adjusted to be greater or smaller through adjusting the characteristic of at least one of the controlling units.

According to various embodiments of the present disclosure, an ion implantation tool includes a process chamber, a platen, an ion source, and a plurality of controlling units. The platen is present in the process chamber and configured to hold a wafer. The ion source is configured to provide an ion beam onto the wafer. The controlling units are present on the platen and configured to apply a plurality of physical fields that are able to affect motions of ions of the ion beam onto the wafer.

According to various embodiments of the present disclosure, an ion implantation tool includes a process chamber, a platen, an ion source, at least one first passive element, at least one first driving unit, at least one second passive element, and at least one second driving unit. The platen is present in the process chamber and configured to hold a wafer. The ion source is configured to provide an ion beam onto the wafer. The first passive element is present on the platen. The first driving unit is configured to drive the first passive element to generate a first field that is able to affect motions of ions of the ion beam onto the wafer. The second passive element is present on the platen. The second driving unit is configured to drive the second passive element to generate a second field that is able to affect motions of ions of the ion beam onto the wafer.

According to various embodiments of the present disclosure, an ion implantation method includes providing an ion beam onto a wafer, and applying a plurality of physical fields that are able to affect motions of ions of the ion beam respectively onto a plurality of regions of the wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An ion implantation tool, comprising:
   a process chamber;
   a platen present in the process chamber and configured to hold a wafer;

an ion source configured to provide an ion beam onto the wafer;

a plurality of electricity providers; and a plurality of controlling units present on the platen, wherein at least one of the controlling units is electrically connected to a first one of the electricity providers, at least one other of the controlling units is electrically connected to a second one of the electricity providers, and the controlling units are configured to apply a plurality of physical fields that are able to affect motions of ions of the ion beam onto the wafer, wherein the physical field applied by the at least one of the controlling units is different from the physical field applied by the at least one other of the controlling units.

2. The ion implantation tool of claim 1, wherein at least one of the controlling units is an electrode.

3. The ion implantation tool of claim 1, wherein at least one of the electricity providers is an electrical potential provider.

4. The ion implantation tool of claim 1, wherein more than one of the controlling units are electrically connected to the first one of the electricity providers, and more than one of the controlling units are electrically connected to the second one of the electricity providers.

5. The ion implantation tool of claim 1, wherein a number of the electricity providers and a number of the controlling units are the same, and the controlling units are respectively electrically connected to the electricity providers.

6. The ion implantation tool of claim 1, wherein at least one of the controlling units, which is electrically connected to the first one of the electricity providers, is a coil.

7. The ion implantation tool of claim 6, wherein at least one of the electricity providers is configured to allow the coil to generate a pair of magnetic poles, and one of the magnetic poles is present between the wafer and the other one of the magnetic poles.

8. The ion implantation tool of claim 6, wherein more than one of the controlling units are electrically connected to the first one of the electricity providers, and more than one of the controlling units are electrically connected to the second one of the electricity providers.

9. The ion implantation tool of claim 6, wherein a number of the electricity providers and a number of the controlling units are the same, and the controlling units are respectively electrically connected to the electricity providers.

10. The ion implantation tool of claim 1, wherein the controlling units are arranged in an array.

11. An ion implantation tool, comprising:

a process chamber;

a platen present in the process chamber and configured to hold a wafer;

an ion source configured to provide an ion beam onto the wafer;

at least one first passive element present on the platen;

at least one first driving unit configured to drive the at least one first passive element to generate a first field that is able to affect motions of ions of the ion beam onto the wafer;

at least one second passive element present on the platen; and at least one second driving unit configured to drive the at least one second passive element to generate a second field that is able to affect motions of ions of the ion beam onto the wafer.

12. The ion implantation tool of claim 11, wherein at least one of the first passive element and the second passive element is at least one electrode.

13. The ion implantation tool of claim 12, wherein at least one of the first driving unit and the second driving unit is at least one electrical potential provider.

14. The ion implantation tool of claim 11, wherein at least one of the first passive element and the second passive element is at least one coil.

15. The ion implantation tool of claim 14, wherein at least one of the first driving unit and the second driving unit is at least one electrical electricity provider.

16. The ion implantation tool of claim 14, wherein a plurality of the first passive elements are electrically connected to the first driving unit.

17. An ion implantation method, comprising:

providing an ion beam onto a wafer; and applying a plurality of physical fields that are able to affect motions of ions of the ion beam respectively onto a plurality of regions of the wafer, wherein the physical fields are generated from a plurality of controlling units, and a first group of the controlling units is electrically connected to an electricity provider, a second group of the controlling units is electrically connected to another electricity provider.

18. The ion implantation method of claim 17, wherein at least one of the physical fields is an electrical field.

19. The ion implantation method of claim 17, wherein at least one of the physical fields is a magnetic field.

20. The ion implantation method of claim 17, wherein at least two of the physical fields are different.

* * * * *